US007947526B2

(12) United States Patent
Chang

(10) Patent No.: US 7,947,526 B2
(45) Date of Patent: May 24, 2011

(54) METHOD OF MAKING BACKSIDE ILLUMINATION IMAGE SENSOR

(75) Inventor: Jen-Tsorng Chang, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/649,513

(22) Filed: Dec. 30, 2009

(65) Prior Publication Data

US 2010/0297804 A1 Nov. 25, 2010

(30) Foreign Application Priority Data

May 20, 2009 (CN) .......................... 2009 1 0302478

(51) Int. Cl.
*H01L 21/00* (2006.01)

(52) U.S. Cl. ..................... 438/69; 438/70; 257/E21.527

(58) Field of Classification Search .................... 438/65, 438/66, 69, 70; 257/E21.527
See application file for complete search history.

(56) References Cited

U.S. PATENT DOCUMENTS

2010/0155868 A1* 6/2010 Jang ............................. 257/432

* cited by examiner

*Primary Examiner* — Hoai v Pham
(74) *Attorney, Agent, or Firm* — Raymond J. Chew

(57) ABSTRACT

An exemplary method for making a backside illumination image sensor includes the follow steps. A substrate having a top surface is firstly provided. Secondly, many recesses are formed in the top surface. Thirdly, a light pervious layer is applied on the top surface. The light pervious layer has a plurality of filling portions received in the recesses. Then, an epitaxial silicon layer is applied on the light pervious layer. Next, many light sensitive regions and circuits are formed on the epitaxial silicon layer. Finally, the substrate is etched to expose the filling portions of the light pervious layer, thereby forming the backside illumination image sensor with the filling portions functioning as micro-lenses.

14 Claims, 7 Drawing Sheets

METHOD OF MAKING BACKSIDE ILLUMINATION IMAGE SENSOR

BACKGROUND

1. Technical Field

The present disclosure relates to image sensors, and particularly to a method for manufacturing a backside illumination image sensor.

2. Description of Related Art

A typical front side illumination image sensor is illuminated from the front (or top) side of a silicon die. Because of processing features (such as metallization, polysilicon, diffusions, etc), a light sensitive region is partially sheltered by, for example, metal wires, thereby resulting in a loss of photons reaching the light sensitive region and a reduction in a collection area for collecting the photons. This results in a reduction of an overall sensitivity of the image sensor.

Therefore, what is needed is a new method of making an illumination image sensor, which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Embodiments will now be described in detail below with reference to the drawings.

Figure 1:
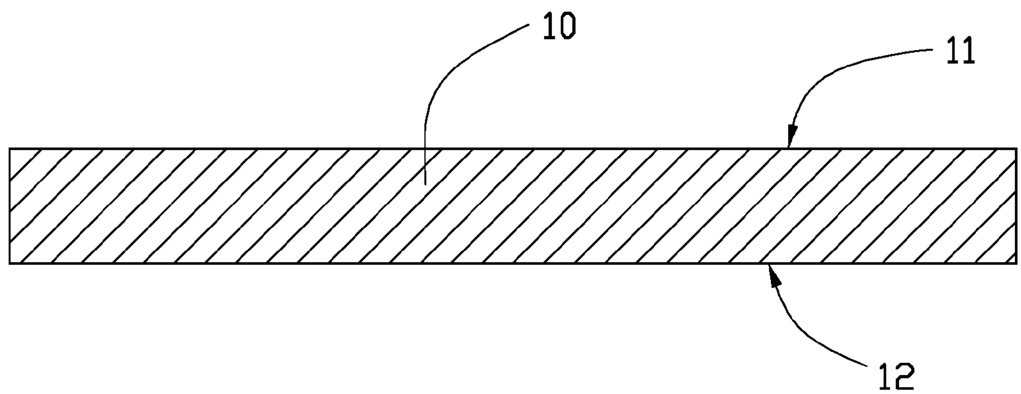
FIGS. 1-7 show successive stages of making a backside illumination image sensor according to an exemplary embodiment.

Referring to FIG. 1, a substrate 10 is provided. The substrate 10 includes a top surface 11, and a bottom surface 12 opposite to the top surface 11. In the present embodiment, the substrate 10 is made of silicon. In other embodiments, the substrate 10 may be made of any other materials, such as germanium, diamond, silicon carbide, gallium arsenide, indium phosphide, etc.

Figure 2:
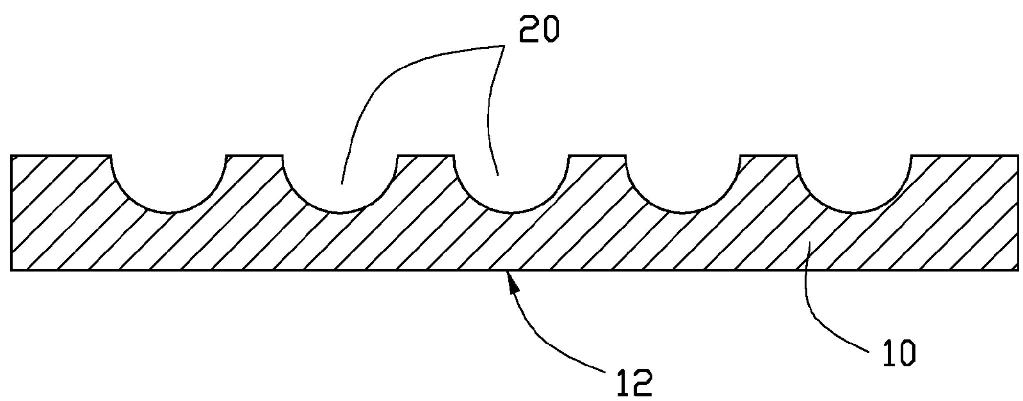

Referring also to FIG. 2, a plurality of recesses 20 are formed in the top surface 11 by etching, e.g., sputter etching or ion beam etching. In the present embodiment, the recesses 20 are spaced a distance from each other, and arranged in an array, e.g. in columns and rows.

Figure 3:
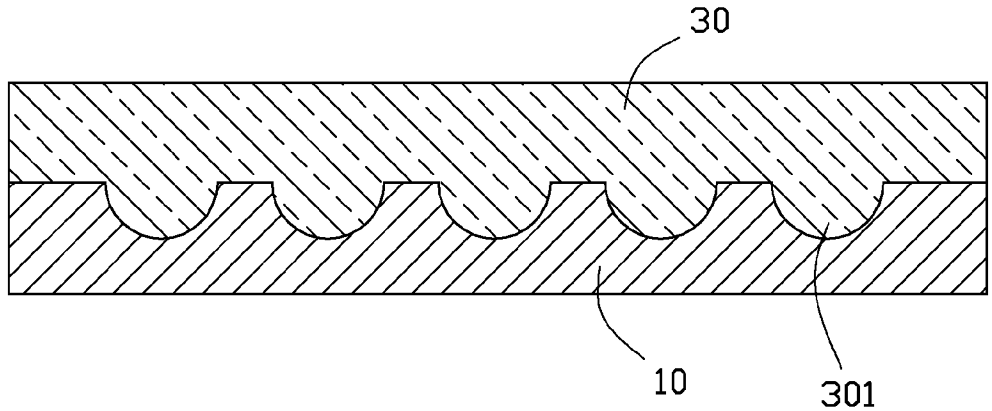

Referring also to FIG. 3, a light pervious layer 30 is applied on the top surface 11 by deposition, e.g., plasma enhanced chemical vapor deposition, or metal-organic chemical vapor deposition. The light pervious layer 30 has a plurality of filling portions 301 received the recesses 201. In the present embodiment, the light pervious layer 30 is made of silicon dioxide. In other embodiments, the light pervious layer 30 may instead be made by any other light pervious material, such as phosphor silicate glass, borosilicate glass, etc.

Figure 4:
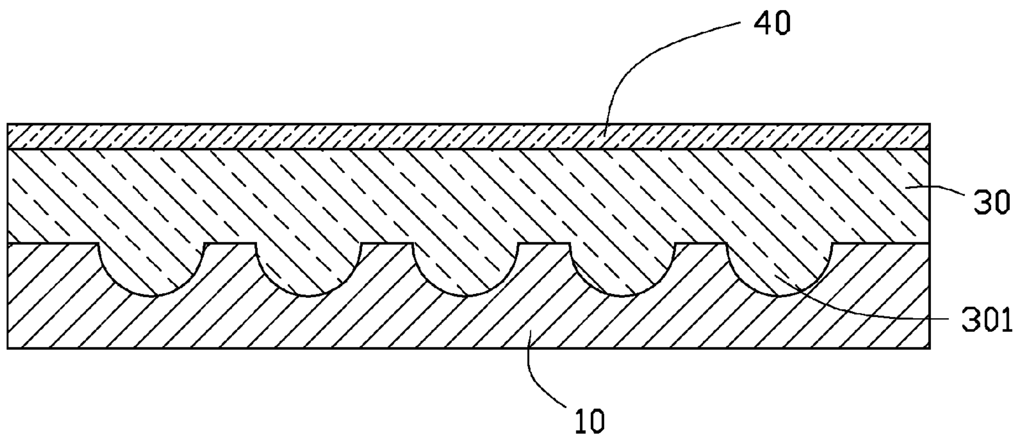

Referring also to FIG. 4, a color filter 40 is formed on the light pervious material 30. In other embodiment, the color filter 40 may be omitted.

Figure 5:
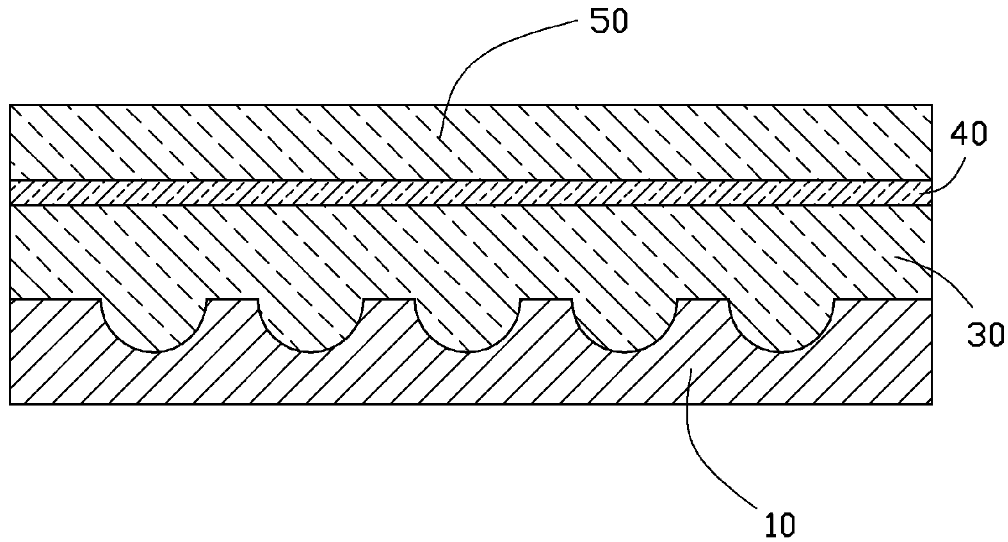

Referring also to FIG. 5, an epitaxial silicon layer 50 is applied on the color filter 40. The thickness of the epitaxial silicon layer 50 is in a range from 1 micrometer to 25 micrometers. In the present embodiment, the epitaxial silicon layer 50 is firstly formed on a silicon substrate/carborundum substrate (not shown) by a epitaxy process, e.g., a liquid phase epitaxy process, a solid phase epitaxy process, a molecular beam epitaxty process, etc; the thickness of the epitaxial silicon layer 50 is 10 micrometers. After removed from the silicon substrate/carborundum substrate, the epitaxial silicon layer 50 is securely applied on the colour filter 40. In other embodiment, the epitaxial silicon layer 50 may be directly formed on the light pervious layer 30 by a epitaxy process, e.g., a liquid phase epitaxy process, a solid phase epitaxy process, a molecular beam epitaxty process, etc.

Figure 6:
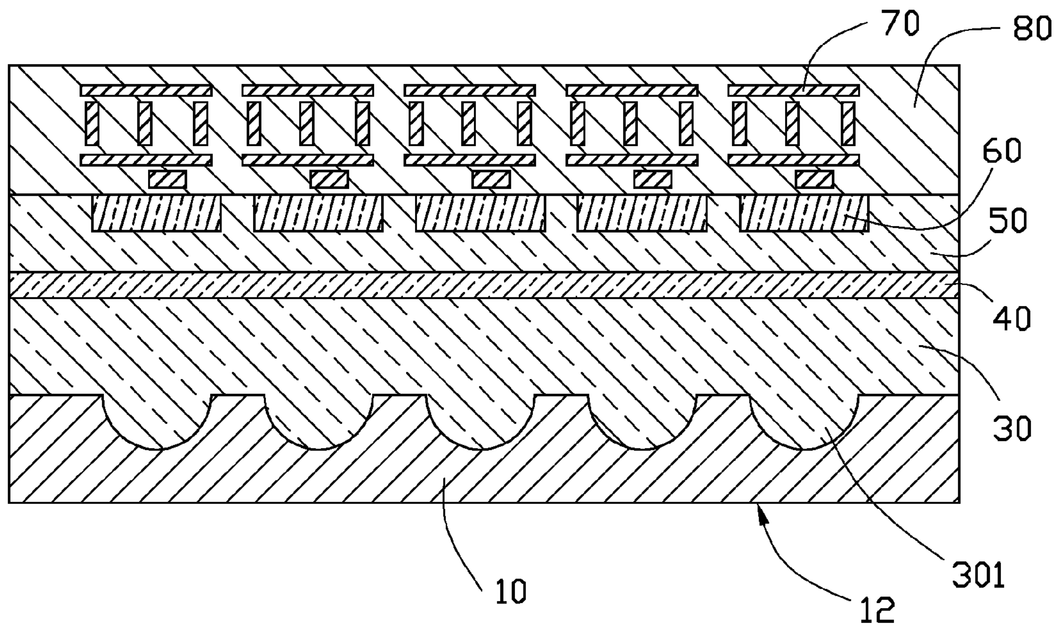

Referring also to FIG. 6, a plurality of light sensitive regions 60 are formed on the epitaxial silicon layer 50, and then a plurality of circuits 70 formed on a circuit layer 80 electrically connected with the light sensitive regions 60 are formed on the epitaxial silicon layer 50. The light sensitive regions 60 are spatially corresponding to the filling portions 301 respectively. In the present embodiment, the light sensitive regions 60 and circuits 70 are formed on the epitaxial silicon layer 50 by double-poly triple-metal (2P3M) complementary metal oxide semiconductor (CMOS) process. In other embodiment, the light sensitive regions 60 and circuits 70 may instead be formed on the epitaxial silicon layer 50 by any other CMOS process, such 2P5M CMOS process, etc.

Figure 7:
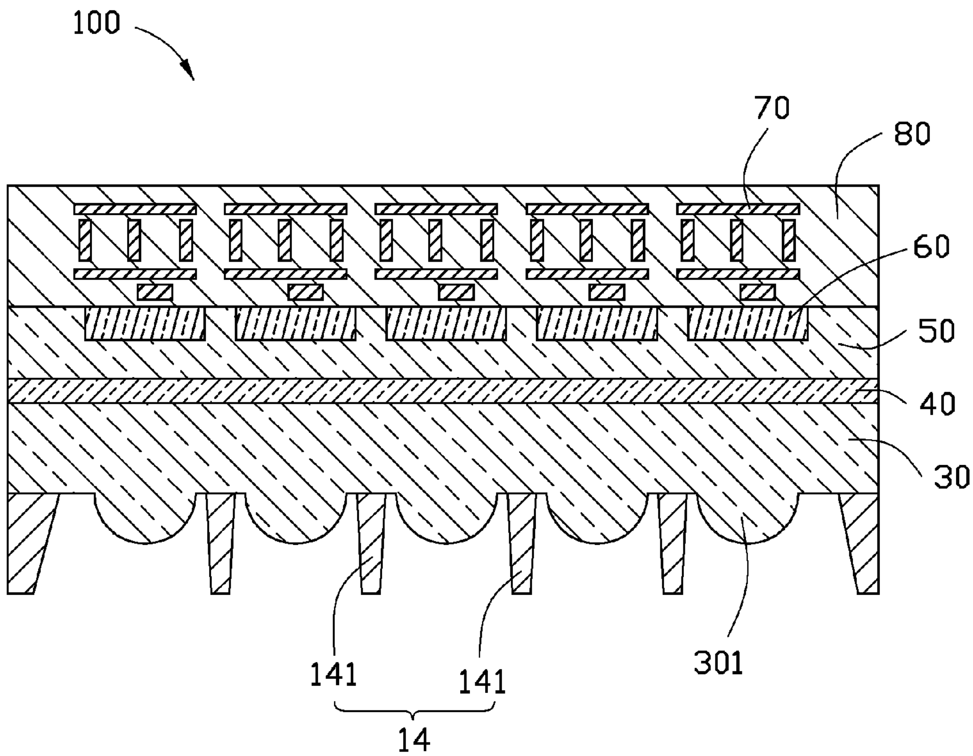

Referring also to FIG. 7, the substrate 10 is etched to expose the filling portions 301 of the light pervious layer 30, thereby obtaining a backside illumination image sensor 100 with the filling portions 301 functioning as micro-lenses. In the present embodiment, the substrate 10 is partially etched to form a network 14 having a plurality of grids 141 surrounding the respective filling portions 301 therein. The grids 141 are configured for protecting the micro-lens against damages. In other embodiments, the substrate 10 may instead be fully etched, thereby making the light pervious layer 30 fully exposed.

In use of the backside illumination image sensor 100, the light sensitive regions 60 collects photons (not shown) from a backside of the light sensitive regions 60. That is, the photons do not need to traverse the circuits 70, as a result, more photons reach the light sensitive regions 60 than those photons reaching light sensitive regions of a front side illumination imager sensor. This results in an increase in an overall sensitivity of the backside illumination image sensor 100. In addition, the thickness of the epitaxial silicon layer 50 can be controlled in the epitaxy, there is no need to thin the epitaxial silicon layer 50 in later process. Dark current (i.e., unwanted current generated by light sensitive regions 60 in the absence of illumination) is reduced/eliminated. Meanwhile, while processing the light sensitive regions 60 and circuits 70 on the epitaxial silicon layer 50, the substrate 10 is configured for supporting the epitaxial silicon layer 50. Therefore, there is no additional structures to support the epitaxial silicon layer 50, thereby lowing cost.

While certain embodiments have been described and exemplified above, various other embodiments will be apparent to those skilled in the art from the foregoing disclosure. The disclosure is not limited to the particular embodiments described and exemplified but is capable of considerable variation and modification without departure from the scope of the appended claims.

What is claimed is:

1. A method for making a backside illumination image sensor, comprising:

providing a substrate, the substrate comprising a top surface;

forming a plurality of spaced recesses in the top surface;

applying a light pervious layer on the top surface, the light pervious layer having a plurality of filling portions received the recesses;

applying an epitaxial silicon layer on the light pervious layer;

forming a plurality of light sensitive regions on the epitaxial silicon layer, the light sensitive regions spatially corresponding to the filling portions respectively;

forming a plurality of circuits on the epitaxial silicon layer;

etching the substrate to expose the filling portions of the light pervious layer, thereby obtaining the backside illumination image sensor with the filling portions functioning as micro-lenses.

2. The method of claim 1, wherein the substrate is comprised of a material selected from the group consisting of silicon, germanium, diamond, silicon carbide, gallium arsenide, and indium phosphide.

3. The method of claim 1, wherein the epitaxial silicon layer is directly formed on the light pervious layer by a epitaxy process.

4. The method of claim 3, wherein the epitaxy process is a liquid phase epitaxy process, a solid phase epitaxy process, or a molecular beam epitaxy process.

5. The method of claim 1, wherein the epitaxial silicon layer is securely glued on the light pervious layer.

6. The method of claim 1, wherein the substrate is partially etched to expose the light pervious layer to form a network having a plurality of grids surrounding the respective micro-lenses therein.

7. The method of claim 1, wherein the light pervious layer is comprised of a material of a group consisting of silicon dioxide, phosphor silicate glass, and borosilicate glass.

8. The method of claim 1, wherein the thickness of the epitaxial silicon layer is in a range from 1 micrometer to 25 micrometers.

9. A method for making a backside illumination image sensor, comprising:

providing a substrate, the substrate comprising a top surface;

forming a plurality of spaced recesses in the top surface;

applying a light pervious layer on the top surface, the light pervious layer having a plurality of filling portions received in the recesses;

forming a filter color layer on the light pervious layer;

forming an epitaxial silicon layer on the filter layer;

forming a plurality of light sensitive regions and circuits on the epitaxial silicon layer;

etching the substrate to expose the filling portions of the light pervious layer, thereby obtaining the backside illumination image sensor with the filling portions functioning as micro-lenses.

10. The method of claim 9, wherein the substrate is comprised of a material selected from the group consisting of silicon, germanium, diamond, silicon carbide, gallium arsenide, and indium phosphide.

11. The method of claim 9, wherein the epitaxial silicon layer is securely glued on the color filter.

12. The method of claim 9, wherein the substrate is partially etched to expose the light pervious layer to form a network having a plurality of grids surrounding the respective micro-lenses therein.

13. The method of claim 9, wherein the light pervious layer is comprised of a material of a group consisting of silicon dioxide, phosphor silicate glass, and borosilicate glass.

14. The method of claim 9, wherein the thickness of the epitaxial silicon layer is in a range from 1 micrometer to 25 micrometers.

* * * * *